United States Patent
Ra

(10) Patent No.: US 6,355,579 B1
(45) Date of Patent: Mar. 12, 2002

(54) METHOD FOR FORMING GATE OXIDE FILM IN SEMICONDUCTOR DEVICE

(75) Inventor: Sa Kyun Ra, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/442,736

(22) Filed: Nov. 18, 1999

(30) Foreign Application Priority Data

Feb. 22, 1999 (KR) .............................................. 99-5853

(51) Int. Cl.[7] .............................................. H01L 82/34
(52) U.S. Cl. ........................ 438/775; 438/758; 438/761; 438/769; 438/786
(58) Field of Search ................................ 438/758, 761, 438/769, 775, 786

(56) References Cited

U.S. PATENT DOCUMENTS

| | | | | |
|---|---|---|---|---|
| 4,282,270 A | * | 8/1981 | Nozaki et al. | 427/93 |
| 5,405,806 A | * | 4/1995 | Pfiester et al. | 437/200 |
| 5,407,870 A | * | 4/1995 | Okada et al. | 437/241 |
| 5,512,519 A | * | 4/1996 | Hwang | 437/242 |
| 5,674,788 A | * | 10/1997 | Wristers et al. | 437/239 |
| 6,207,587 B1 | * | 3/2001 | Li et al. | 438/769 |
| 6,235,590 B1 | * | 5/2001 | Daniel et al. | 438/275 |

OTHER PUBLICATIONS

Knolle et al., "Plasma Deposited Silicon Oxynitride from Silane, Nitrogen, and Carbon Dioxide or Carbon Monoxide or Nitric Oxide", J. Electrochem. Soc., vol. 139, No. 11, Nov. 1992.*

G. Bronner et al., "A Fully Planarized 0.25$\mu$m CMOS Technology for 256Mbit DRAM and Beyond", 1995 Symposium on VLSI Technology Digest of Technical Papers, pp. 15–16.

E. Wu et al., "Thickness and Polarity Dependence of Intrinsic Breakdown of Ultra–Thin Reoxidized–Nitride for DRAM Technology Applications", 1997 IEDM, pp. 4.2.1–4.2.4.

Y. Okayama et al., "Nitrogen Concentration Optimization for Down–Scaled CMOSFET with $N_2O$–based Oxynitride Process", 1998 Symposium on VLSI Technology of Technical Papers, pp. 220–221.

* cited by examiner

Primary Examiner—Charles Bowers
Assistant Examiner—Lisa Kilday
(74) Attorney, Agent, or Firm—Morgan, Lewis & Bockius LLP

(57) ABSTRACT

Method for forming a gate oxide film in a semiconductor device, in which a gate oxide film is formed by a first and second processes of oxidizing and nitriding, wherein the first process uses gases having different nitrogen contents from the second process for improving device performances, including the steps of (1) providing a semiconductor substrate, (2) conducting a thermal process in a compound gas environment of oxygen and nitrogen having a nitrogen content below 5%, to form a first oxynitride film on the semiconductor substrate, and (3) conducting a thermal process in a compound gas environment of oxygen and nitrogen having a nitrogen content equal to or over 5%, to form a second oxynitride film.

7 Claims, 12 Drawing Sheets

Oxidation in $O_2$ gas ambient

Oxynitridation in $N_2O$ gas or No gas ambient

METHOD FOR FORMING GATE OXIDE FILM IN SEMICONDUCTOR DEVICE

BACKGROUND OF THE INVENTION

1. Field of the Invention

The present invention relates to a semiconductor device, and more particularly, to a method for forming a gate oxide film in a semiconductor device, in which a gate oxide film is formed by first/second oxidizing/nitriding processes using gases having different nitrogen contents for improving device performances.

2. Background of the Related Art

In general, the gate oxide film is formed by thermal oxidation using a furnace. However, since the gate oxide film formed by the thermal oxidation can not meet dielectric characteristic requirements for high density device packings, RTP(Rapid Thermal Process) oxidation using $N_2O$ or NO gas is newly suggested.

A related art method for forming a gate oxide film in a semiconductor device will be explained with reference to the attached drawings. FIGS. 1a~1h illustrate sections showing the steps of a related art method for forming a gate oxide film in a semiconductor device.

Referring to FIG. 1a, the related art method for forming a gate oxide film in a semiconductor device by the RTP oxidation starts from forming a device isolation layer 2 by field oxidation on a device isolation region in a semiconductor substrate 1. Then, a sacrificial oxide film 7 is formed on an active region defined by the device isolation layer 2 for suppressing possible damages to the substrate 1 in a later process. The active region includes an NMOS and a PMOS transistor forming regions. A photoresist layer 3 is formed on the PMOS transistor forming region having the sacrificial oxide film 7 formed thereon, and impurity is injected into the NMOS transistor forming region for forming a p type well therein using the photoresist layer 3 as a mask. Then, as shown in FIG. 1b, the photoresist layer 3 is removed, a photoresist layer 4 is formed on the NMOS transistor forming region again, and impurity is injected into the PMOS transistor forming region for forming an n type well therein using the photoresist layer 4 as a mask. As shown in FIG. 1c, the p type well 5 and the n type well 6 are formed by a well diffusion process. As shown in FIG. 1d, a photoresist layer 8 is formed on the PMOS transistor forming region having the n type well 6 formed therein, and impurity ions are injected therein for adjusting a threshold voltage of the transistor. As shown in FIG. 1e, the photoresist layer 8 is removed, a photoresist layer 9 is formed again on the NMOS transistor forming region having the p type well 5 formed therein, and impurity ions are injected into the PMOS transistor forming region having the n type well 6 formed therein for adjusting a threshold voltage of the transistor. Then, as shown in FIG. 1f, the sacrificial oxide film 7 is removed, which was formed for preventing damages to be otherwise given to the substrate in the impurity injection for forming the well regions and in the impurity injection for adjusting the threshold voltage. And, as shown in FIG. 1g, a gate oxide film 10 is formed by wet oxidation using a pyro system furnace. Different from the aforementioned oxidation, as shown in FIG. 1h, a RTP equipment is used in processing an oxynitridation in an $N_2O$ or NO gas ambient, to form a gate oxide film 11 containing nitrogen. Though not shown, polysilicon, barrier metal, gate metal, and gate capping layers are formed on an entire surface of the semiconductor substrate 1 and subjected to selective patterning, to form a gate line. In order to meet the dielectric characteristic requirements for the device, a thickness of the gate oxide film should be below 50 Å in the case when the gate oxide film is formed by the related art thermal oxidation. However, the electron tunneling occurred in the case of the gate oxide film with a thickness below 50 Å deteriorates device performances. The RTP oxide/nitride film formed using $N_2O$ or NO gas suggested for solving the foregoing problem meets the dielectric constant requirement for a high density device packing.

However, the related art gate oxide film in a semiconductor device has the following problems.

First, the oxide film formed using a furnace can not meet the dielectric constant requirement for a high density device packing, and the oxide film formed to a thickness below 50 Å for meeting the dielectric constant requirement causes electron tunneling, that is not suitable for a gate insulating layer.

Second, the oxide/nitride film formed in a RTP equipment using $N_2O$ or NO gas is involved in deterioration of TDDB (Time Dependent Dielectric Breakdown) coming from a breakdown voltage drop of the gate oxide layer and a leakage current increase caused by a nitrogen content increase at an interface of the oxide/nitride film and the substrate and an increased roughness of the interface, which drops a device reliability.

SUMMARY OF THE INVENTION

Accordingly, the present invention is directed to a method for forming a gate oxide film in a semiconductor device that substantially obviates one or more of the problems due to limitations and disadvantages of the related art.

An object of the present invention is to provide a method for forming a gate oxide film in a semiconductor device, which can improve a device performance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a gate oxide film in a semiconductor device includes the steps of (1) providing a semiconductor substrate, (2) conducting a thermal process in a compound gas environment of oxygen and nitrogen having a nitrogen content below 5%, to form a first oxynitride film on the semiconductor substrate, and (3) conducting a thermal process in a compound gas environment of oxygen and nitrogen having a nitrogen content equal to or over 5%, to form a second oxynitride film, thereby forming a gate oxide film by a first and second processes of oxidizing and nitriding, wherein the first process uses gases having different nitrogen contents from the second process, whereby improving device performances.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 2a~2h illustrate sections each showing the steps of a method for forming a gate oxide film in a semiconductor device in accordance with a preferred embodiment of the present invention. In the method for forming a gate oxide film in accordance with a preferred embodiment of the present invention, a first and second processes of oxidizing and nitriding are proceeded in gas ambient of which nitrogen contents are different from process to process. That is, in the first process of oxidizing and nitriding, NO and $O_2$ gases are used, of which NO gas ratio to $O_2$ is below 20%. And, in the second process of oxidizing and nitriding, NO and $O_2$ gases or $N_2O$ gas is used, and when NO and $O_2$ gases are used, an NO gas ratio to $O_2$ is over 20%.

Figure 1A:
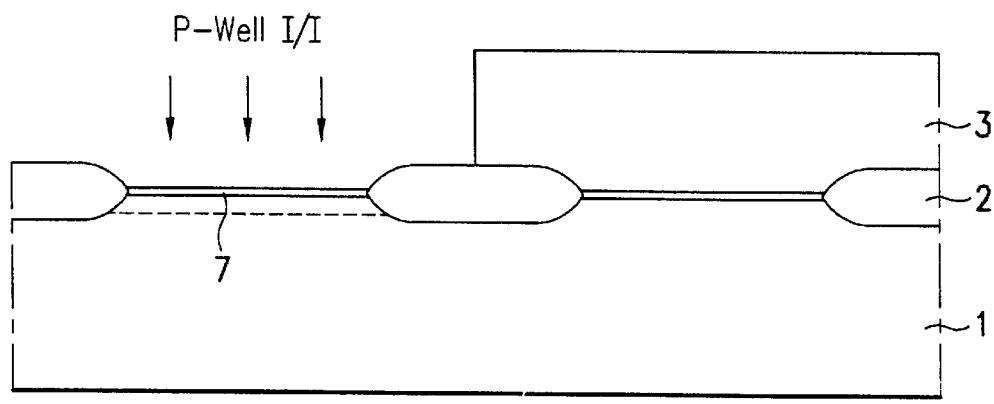
FIGS. 1a~1h illustrate sections showing the steps of a related art method for forming a gate oxide film in a semiconductor device.
Figure 1B:
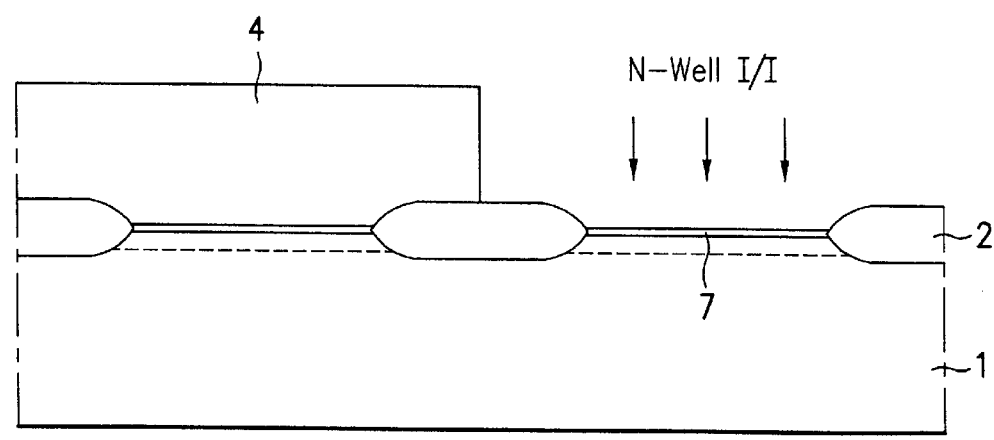
Figure 1C:
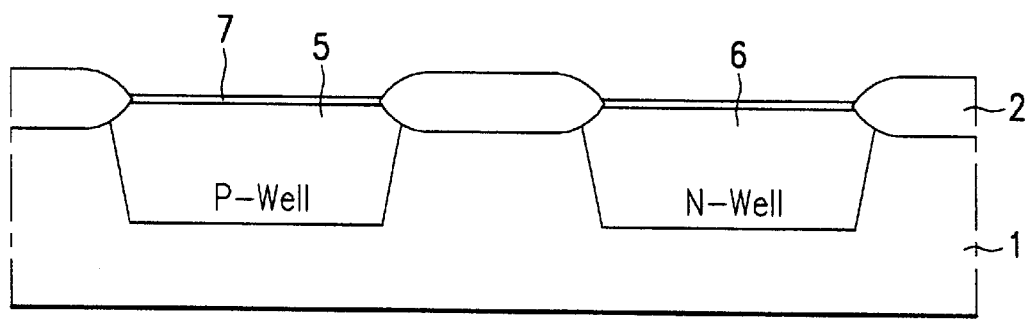
Figure 1D:
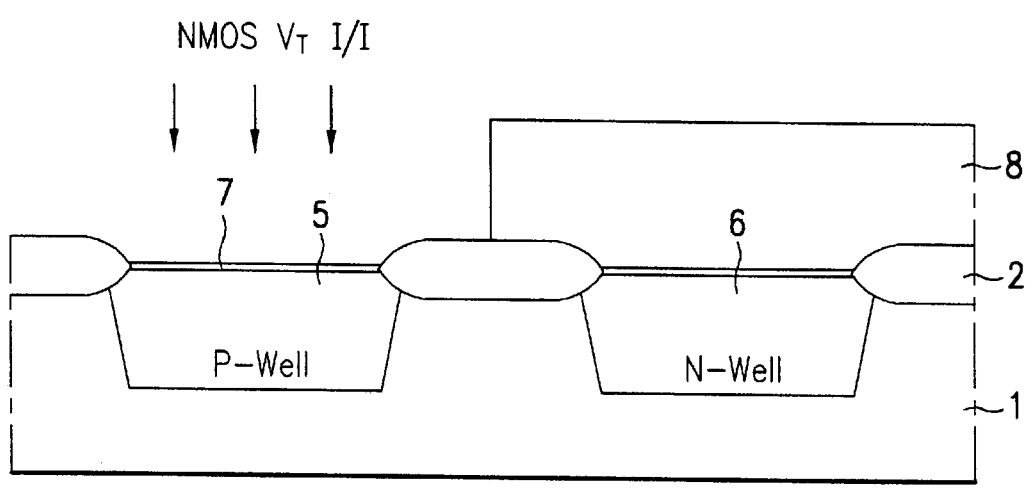
Figure 1E:
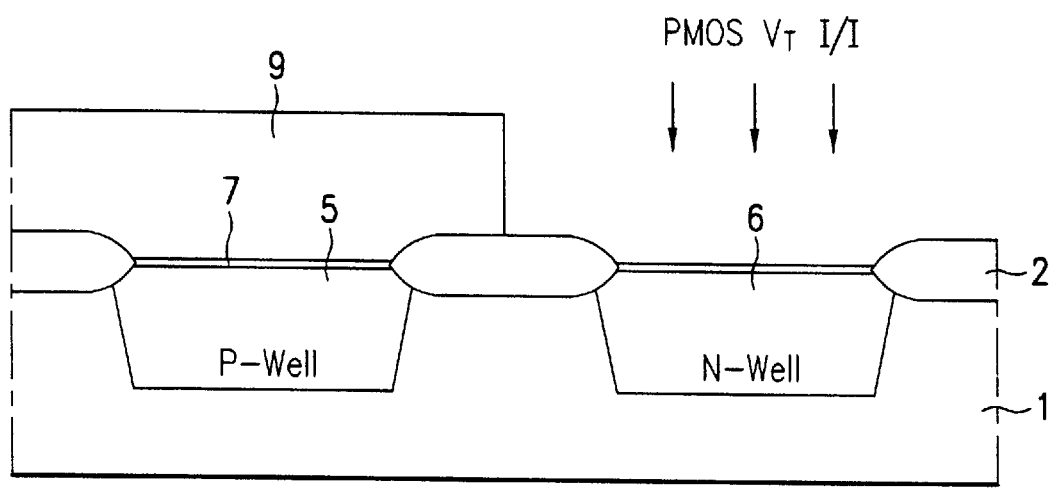
Figure 1F:
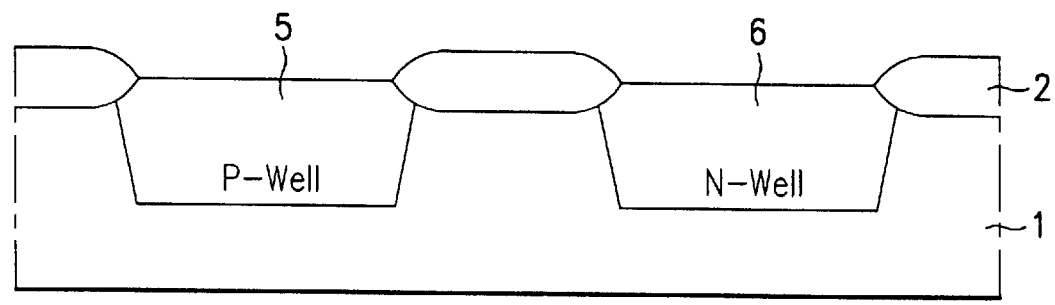
Figure 1G:
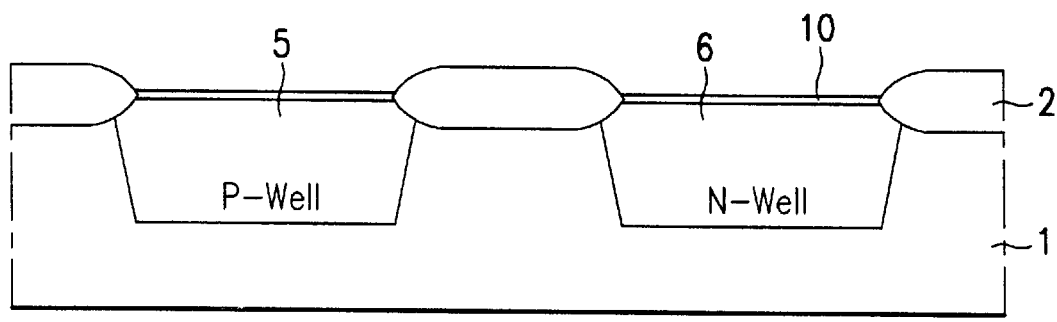
Figure 1H:
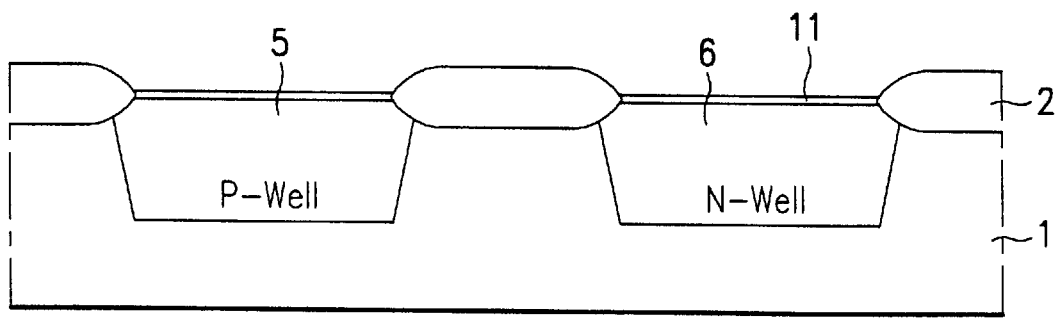
Figure 2A:
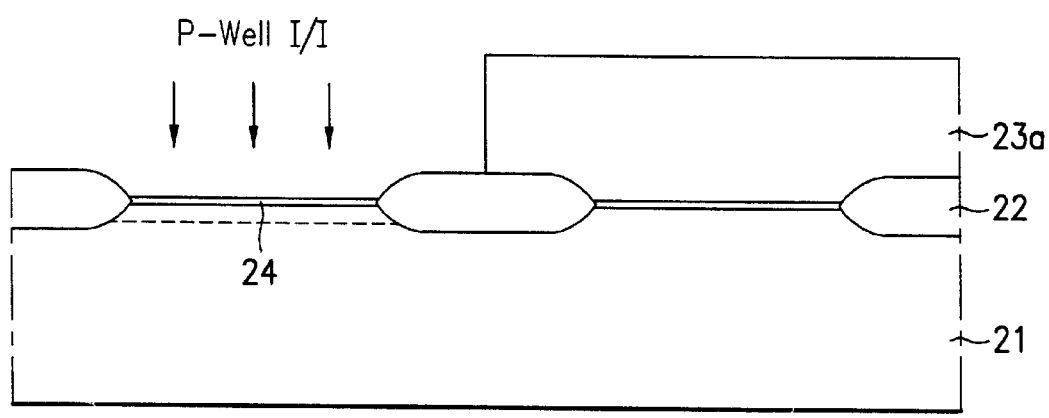
FIGS. 2a~2h illustrate sections each showing the steps of a method for forming a gate oxide film in a semiconductor device in accordance with a preferred embodiment of the present invention.
Figure 2B:
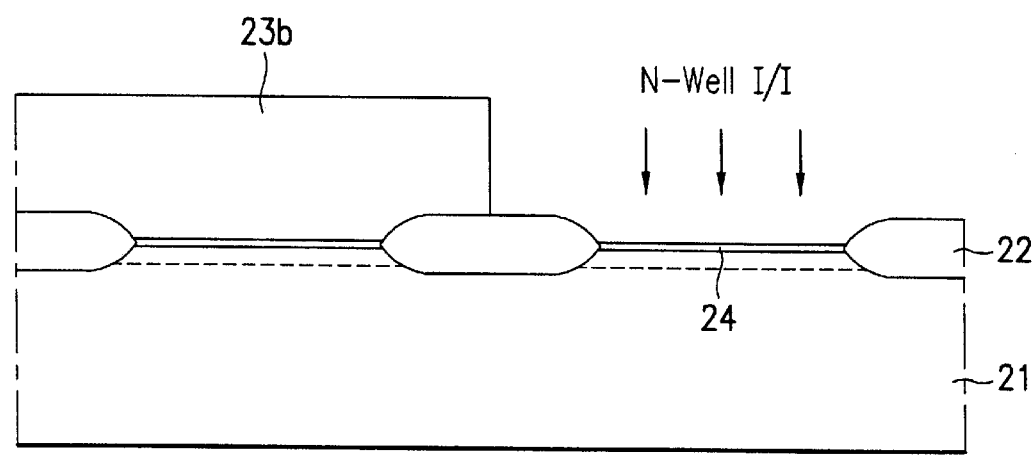
Figure 2C:
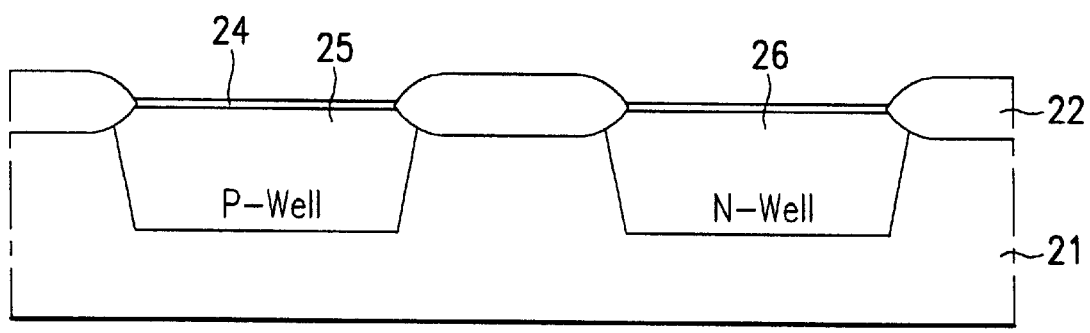
Figure 2D:
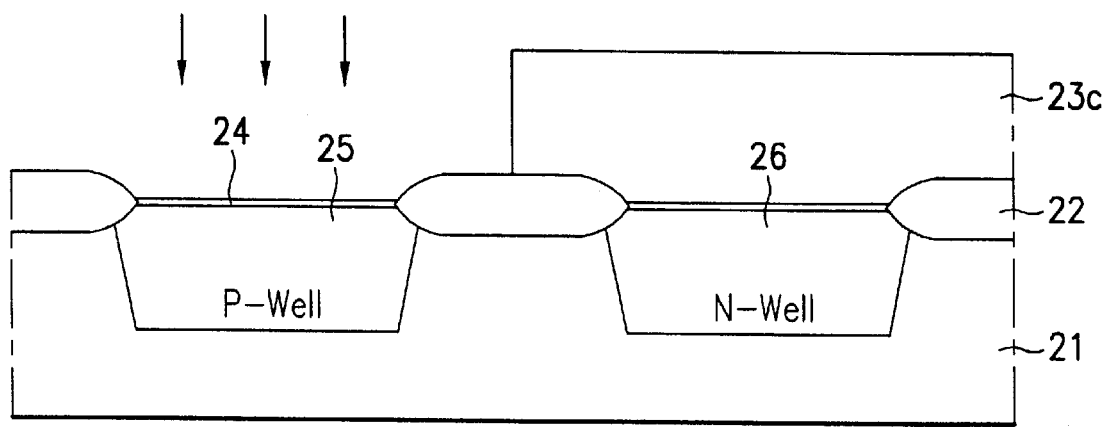
Figure 2E:
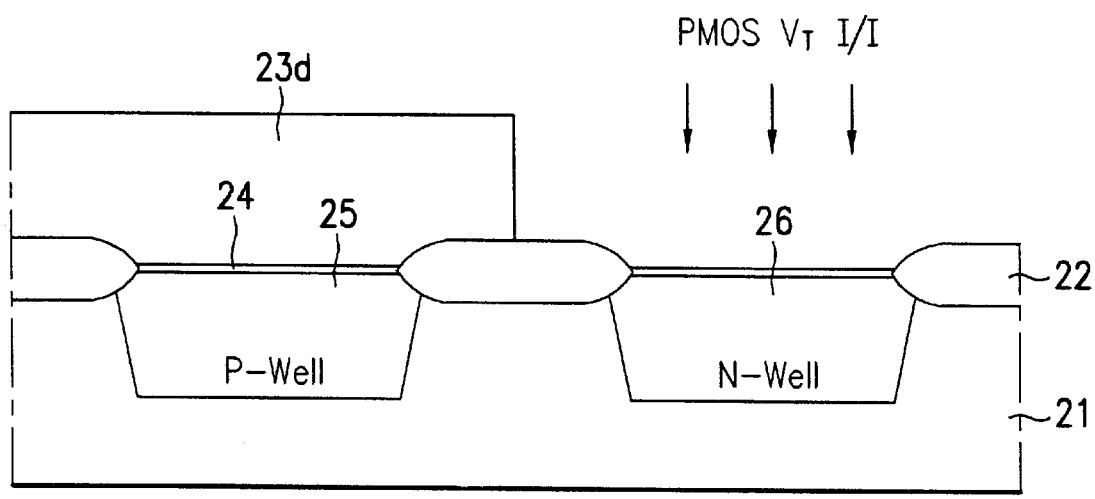
Figure 2F:
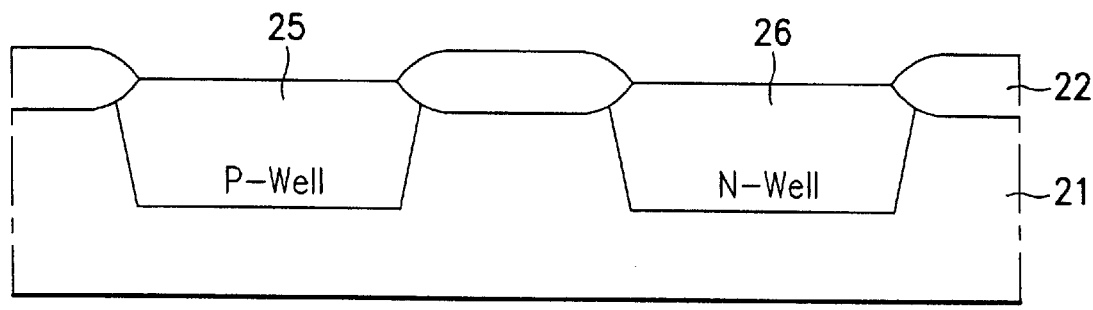
Figure 2G:
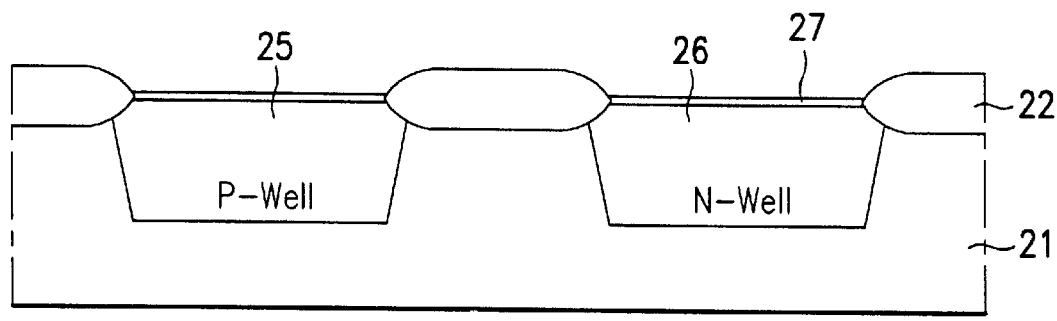
Figure 2H:
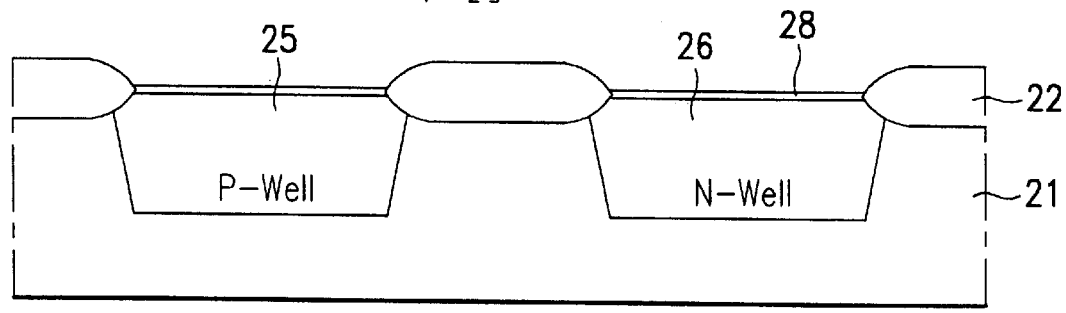

Referring to FIG. 2a, the method for forming a gate oxide film in a semiconductor device in accordance with a preferred embodiment of the present invention starts with forming a device isolation layer 22 in a device isolation region of a semiconductor substrate 21 by field oxidation. A sacrificial oxide film 24 is formed on the active region defined by the device isolation layer 22 to suppress possible damages to the substrate in a later process. The active region has NMOS and PMOS transistor forming regions. Then, a photoresist layer 23a is formed on the PMOS transistor forming region having the sacrificial oxide film 24 formed thereon, and impurity is injected into the NMOS transistor forming region using the photoresist layer 23a as a mask for forming a p type well. As shown in FIG. 2b, the photoresist layer 23a is removed, a photoresist layer 23b is formed on the NMOS transistor forming region again, and impurity is injected into the PMOS transistor forming region using the photoresist layer 23b as a mask for forming an n type well. As shown in FIG. 2c, the p type well 25 and the n type well 26 are formed by a well diffusion process. Then, as shown in FIG. 2d, a photoresist layer 23c is formed on the PMOS transistor forming region having the p type well 25 formed therein, and impurity ions are injected for adjusting a threshold voltage of the transistor. And, as shown in FIG. 2e, the photoresist layer 23c is removed, a photoresist layer 23d is formed again on the NMOS transistor forming region having the p type well 25 formed therein, and impurity ions are injected into the PMOS transistor forming region having the n type well formed therein, for adjusting a threshold voltage of the transistor. As shown in FIG. 2f, the sacrificial oxide film 24 is removed, which was formed for preventing damages to the substrate in the impurity injection for forming the well regions and in the impurity injection for adjusting the threshold voltage. And, as shown in FIG. 2g, a first process of oxidizing and nitriding is conducted in a NO & $O_2$ ambient which provides a good oxidation uniformity in a RTP equipment, to form a first oxynitride film 27. The ratio of NO to $O_2$ is below 20%. That is, a ratio of the nitrogen content only to the entire gas in the first process of oxidizing and nitriding is below 10%. Moreover, setting a ratio of NO to $O_2$ in the first process of oxidizing and nitriding to be below 10% provides the best gate oxide film. That is, when the ratio of the nitrogen content only to the entire gas in the first process of oxidizing and nitriding is below 5%, the best gate oxide film is provided. Then, as shown in FIG. 2h, a second process of oxidizing and nitriding is conducted in $N_2O$ or NO & $O_2$ ambient, to form a second oxynitride film 28. When heat treatment is conducted using NO and $O_2$ gases, a ratio of the NO gas to the $O_2$ gas is below 20%. And, a ratio of the nitrogen content only to the entire gas in the second processes of oxidizing and nitriding is over 10%. Moreover, in the second process of oxidizing and nitriding, setting a ratio of NO gas to $O_2$ gas to be 60~70% provides the best gate oxide film. That is, a ratio of the nitrogen content only to the entire gas set to be 30~35% provides the best gate oxide film. The first and second process of oxidizing and nitriding are conducted at 10 Torr~760 Torr and 700~1150° C. Though not shown in the drawings, polysilicon, barrier metal, gate metal and gate capping layers are formed on an entire surface of the semiconductor substrate 21 having the gate oxide film 28 formed thereon in later processes, and subjected to selective patterning to form a gate line.

Figure 3A:
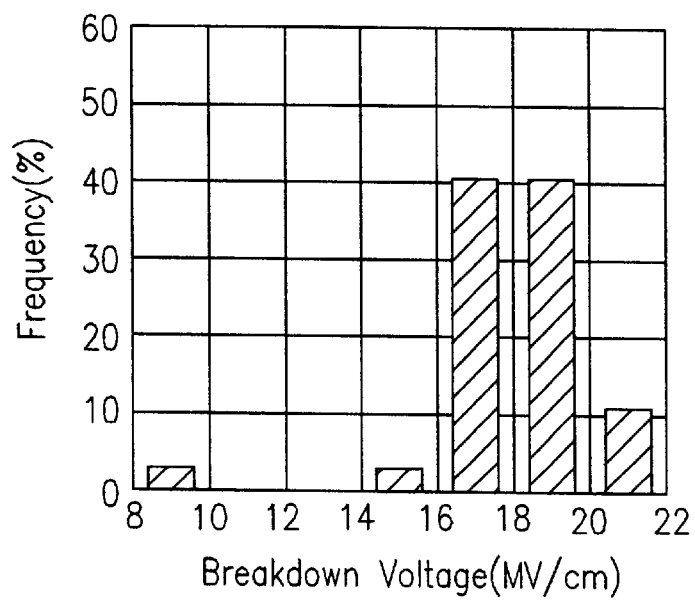
FIGS. 3a~3c illustrate graphs each showing breakdown voltage characteristics of the gate oxide film of the present invention.
Figure 3B:
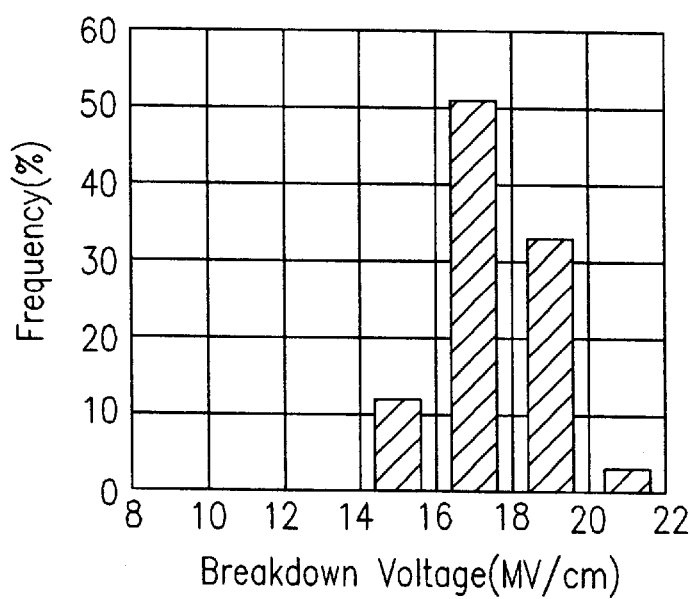
Figure 3C:
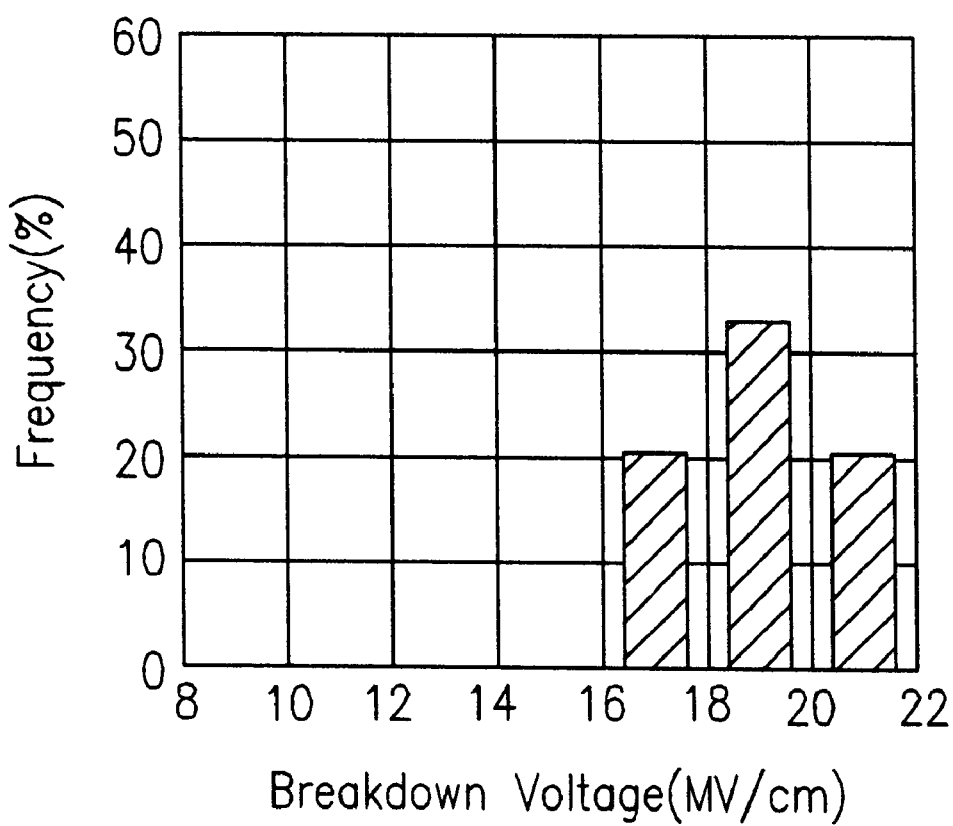
Figure 4A:
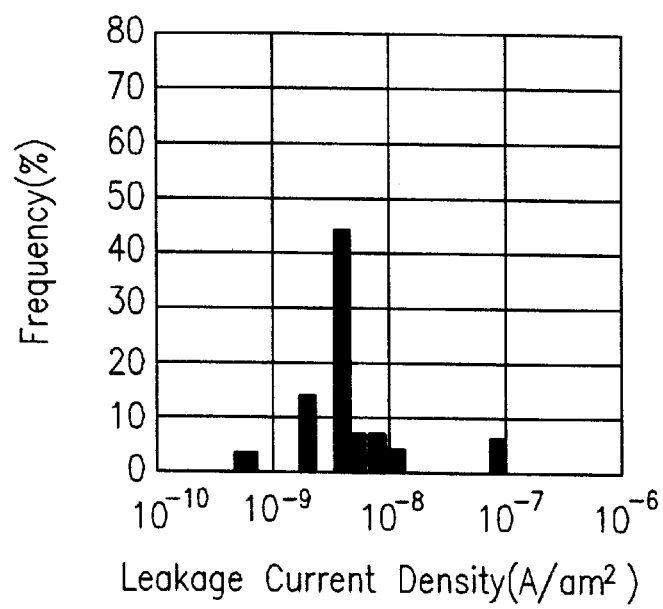
FIGS. 4a~4c illustrate graphs each showing leakage current characteristics of the gate oxide film of the present invention; and, FIG. 5 illustrates a graph showing TDDB characteristics of the gate oxide film of the present invention.
Figure 4B:
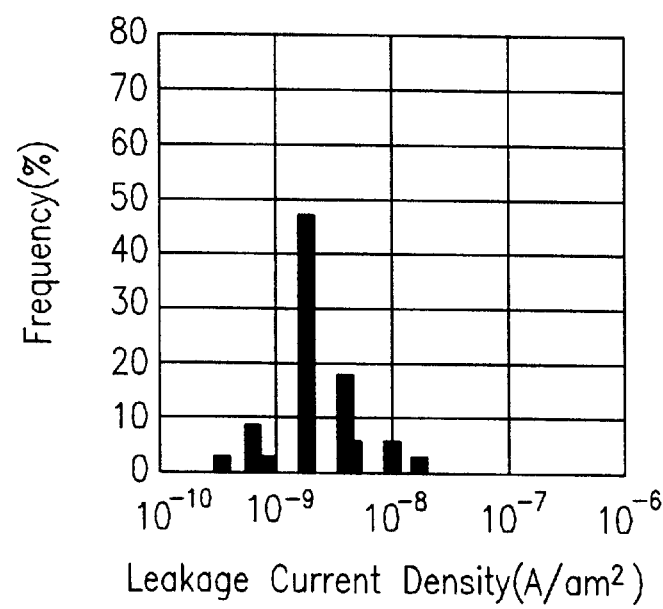
Figure 4C:
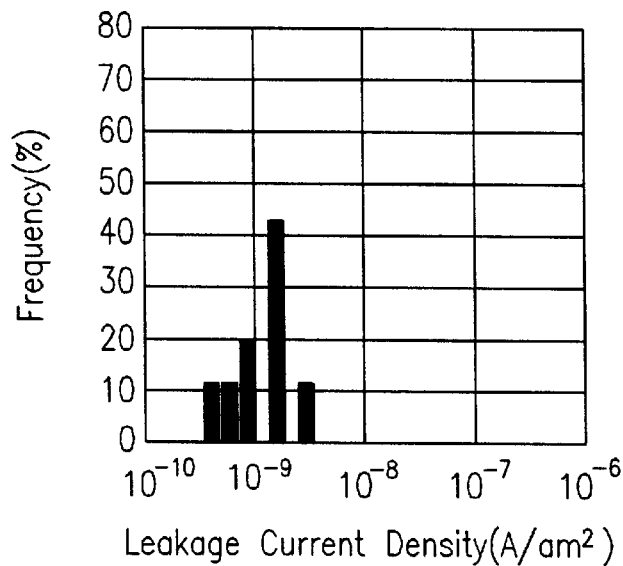

The operational characteristics of the gate oxide film of the present invention formed according to the aforementioned process will be explained. FIGS. 3a~3c illustrate graphs each showing breakdown voltage characteristics of the gate oxide film of the present invention, FIGS. 4a~4c illustrate graphs each showing leakage current characteristics of the gate oxide film of the present invention, and FIG. 5 illustrates a graph showing TDDB characteristics of the gate oxide film of the present invention.

When an oxynitride film is formed in the first oxidizing/nitriding, setting a ratio of NO gas to $O_2$ gas to be below 20%, in the process for forming a gate oxide film in a semiconductor device of the present invention, an oxide film content in the oxynitride film is greater than a nitride film content. The oxide film content is formed greater than the nitride film content in the oxynitride film because of the following reason. If the oxide film content in the oxynitride film is greater, an interface between the semiconductor substrate 21 and the gate oxide film is not stable even if the dielectric constant is reduced. This is, because a crystal structure of the oxide film is more stable than the nitride film, the oxide film has less dangling bonds that trap charges at the interface. The oxynitride film formed in the second oxidizing/nitriding, setting a ratio of NO gas to $O_2$ gas over 20%, has a nitride film content greater than an oxide film content. The second oxynitride film is formed to have the nitride film content greater than the oxide film content, for increasing a dielectric constant of the film. That is, if a gate insulating layer is formed according to the aforementioned process, the second oxynitride film 28 is formed to contain less than 1 atomic % of nitrogen at an interface with the semiconductor substrate 21, resulting to form the interface between the semiconductor substrate 21 and the second oxynitride film 28 less rough. This is because of an improved uniformity of the film coming from dilution of an NO gas content in growth of the oxide film in formation of the second oxynitride film 28. The improved uniformity of the film provides better breakdown voltage characteristics in an actual device operation as shown in FIGS. 3a~3c. FIG. 3a illustrates breakdown voltage characteristics of an oxynitride film formed to 65 Å in $N_2O$ ambient using a furnace. And, FIG. 3b illustrates breakdown voltage characteristics of an oxynitride film formed to 65 Å in $N_2O$ it ambient using a RTP equipment. FIG. 3c, showing improved breakdown voltage characteristics compared to those of FIGS. 3a and 3b, illustrates a graph showing breakdown voltage characteristics of an oxynitride film of the present invention formed by forming a first oxynitride film using a RTP equipment and forming a second oxynitride film again using an NO gas of which content is diluted to have a nitrogen content at an interface between the second oxynitride film and the semiconductor substrate 21 to be less than 1 atomic %. x-axis represents breakdown voltages, where the MV in MV/cm denotes mega voltages and the cm denotes a thickness of the gate insulating film in centimeters. y-axis represents a ratio of brokendown devices out of entire devices. FIGS. 3a, 3b and 3c compare breakdown voltage characteristics of a furnace $SiO_2$, RTN $N_2O$ oxide, and a RTP oxide of the present invention. The graphs in FIGS. 3a, 3b and 3c are interpreted that the higher a ratio of devices brokendown at a high voltage, the higher the quality of the gate insulating film. Since the gate insulating film of the present invention is brokendown at 18 MV it can be known that the breakdown voltage characteristics of the gate insulating film of the present invention is better than the gate insulating films formed according to other methods.

Moreover, it can be known that the embodiment of the present invention in which the second oxynitride film is used as a gate insulating layer shows an improved leakage current characteristics. FIG. 4a illustrates a graph showing an occurrence frequency of leakage current of a gate oxide film formed to 65 Å in a furnace, and FIG. 4b illustrates a graph showing an occurrence frequency of leakage current of an oxynitride film formed to 65 Å in a RTP equipment using $N_2O$ gas ambient. In comparison to these, it can be known that the method of the present invention has improved leakage current characteristics as illustrated in FIG. 4c, wherein x-axis represents leakage currents(in $A/cm^2$, 'A' denotes a current unit, and $cm^2$ denotes an area of insulating film in square centimeters), and y-axis represents a ratio of devices from which leakage currents are occurred to entire devices. And, FIGS. 4a, 4b and 4c compare leakage current characteristics of a furnace $SiO_2$, RTN $N_2O$ oxide, and a RTP oxide of the present invention. The graphs in FIGS. 4a, 4b and 4c are interpreted that the higher a ratio of devices having leakage currents occurred at low values, the higher the quality of the gate insulating film. Since the gate insulating film of the present invention shows beginning of leakage current occurrence at 10E19, it can be known that the leakage current occurrence of the gate insulating film of the present invention is smaller than the gate insulating films formed according to other methods.

Figure 5:
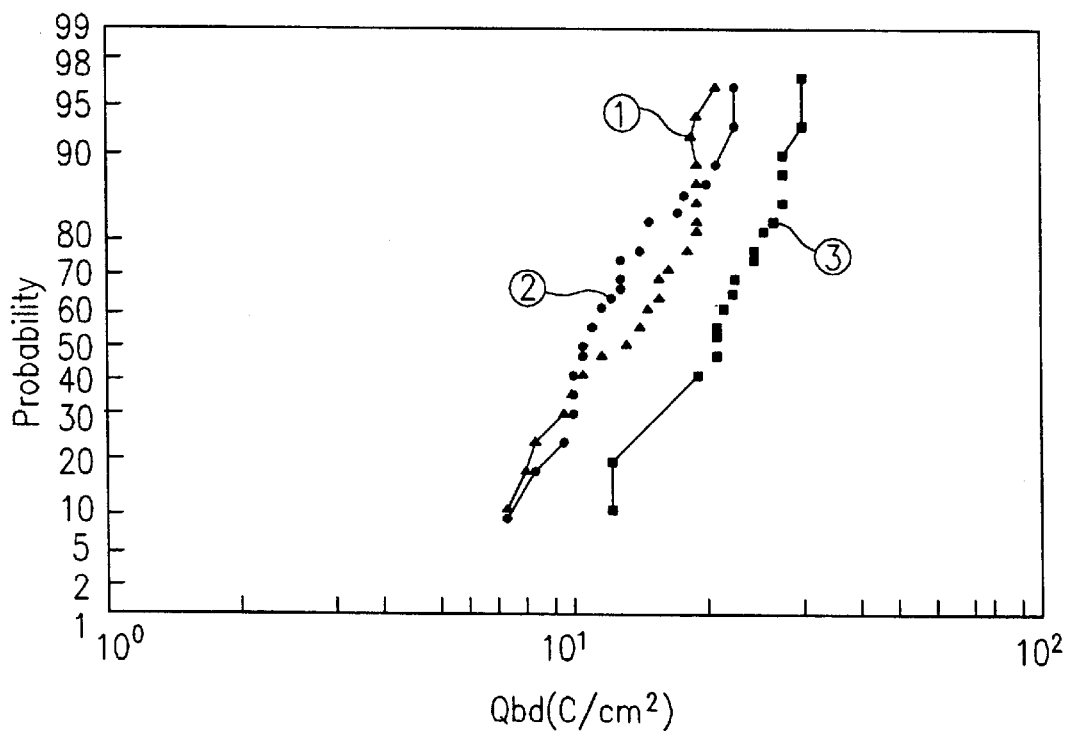

FIG. 5 illustrates that an improved roughness of an interface of the gate insulating layer improves a TDDB characteristics in terms of time vs. dielectric film breakdown. The more the charge accumulated in the dielectric film, the longer the endurance time period. x-axis represents a quantity of broken down charge in Qbd(charge breakdown in $C/cm^2$), and y-axis represents a ratio of devices broken down to an entire devices. FIG. 5 is interpreted that the more the charges kept in the dielectric film at breakdown, the better the quality of the gate insulating film. In FIG. 5a curve ① represents TDDB characteristics of a case of an oxide film formed to a thickness of 65 Å in a furnace, a curve ② represents TDDB characteristics of a case of oxynitride film formed to a thickness of 65 Å in N2O ambient using a RTP equipment, and a curve ③ represents TDDB characteristics of a gate oxide film of the present invention, that shows the best characteristics.

As multiple oxynitride film is provided for a gate insulating layer, the method for forming a gate oxide film in a semiconductor device of the present invention has the following advantages.

First, as a gate insulating film can be formed with a nitrogen content in an interface with a semiconductor substrate to be below 1 atomic %, a surface roughness can be improved, that means an improvement of TDDB characteristic of the gate insulating layer with an improvement of a device reliability.

Second, the improved uniformity of the gate oxide film improves breakdown voltage characteristics and reduces a leakage current.

Third, device performances can be improved as characteristics of an interface between a semiconductor substrate and a gate oxide film can be made stable and a dielectric constant at an upper layer can be made greater by forming a first oxynitride film to have a higher oxide film content and a second oxynitride film to have a higher nitride film content.

It will be apparent to those skilled in the art that various modifications and variations can be made in the method for forming a gate oxide film in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a gate oxide film in a semiconductor device, comprising the steps of:
   (1) providing a semiconductor substrate;
   (2) conducting a thermal process in a compound gas environment of oxygen and nitrogen having a nitrogen content below 5%, to form a first oxynitride film on the semiconductor substrate; and,
   (3) conducting a thermal process in a compound gas environment of oxygen and nitrogen having a nitrogen content equal to or over 5%, to form a second oxynitride film.

2. A method for forming a gate oxide film in a semiconductor device, comprising the steps of:
   conducting a thermal process in a first compound gas environment of oxygen and nitrogen to form a first oxynitride film on a semiconductor substrate; and
   conducting a thermal process in a second compound gas environment of oxygen and nitrogen to form a second oxynitride film on the semiconductor substrate, wherein the first oxynitride film is formed in the first gas environment comprising NO and $O_2$ with a ratio of the NO gas to the $O_2$ gas to be below 20%, and the second oxynitride film is formed in the second gas environment comprising NO and $O_2$ with a ratio of the NO gas to the $O_2$ gas to be equal to or greater than 20%.

3. A method as claimed in claim 2, wherein the first oxynitride film is formed with the ratio of the NO gas to the $O_2$ gas to be 10%, and the second oxynitride film is formed with the ratio of the NO gas to the $O_2$ gas to be 60~70%.

4. A method as claimed in claim 1, wherein the second oxynitride film is formed using $N_2O$ gas.

5. A method as claimed in claim 1, wherein the thermal processes in the steps (2) and are conducted in a RTP equipment under 10 Torr~760 Torr at 700~1150° C.

6. A method as claimed in claim 1, wherein a lower layer portion of the gate insulating film in contact with the semiconductor substrate is formed to contain below 1 atomic % of nitrogen.

7. A method for forming a gate oxide film in a semiconductor device, comprising the steps of:

(1) providing a semiconductor substrate;

(2) conducting a thermal process in a compound gas environment of oxygen and nitrogen having a nitrogen content below 5%, to form a first oxynitride film on the semiconductor substrate; and, (3) conducting a thermal process in a nitrogen compound gas environment containing oxygen, to form a second oxynitride film.

* * * * *